United States Patent [19]
Petrick et al.

[11] Patent Number: 6,073,343
[45] Date of Patent: Jun. 13, 2000

[54] METHOD OF PROVIDING A VARIABLE GUARD RING WIDTH BETWEEN DETECTORS ON A SUBSTRATE

[75] Inventors: Scott W. Petrick, Sussex, Wis.; Robert F. Kwasnick, Palo Alto, Calif.; Rowland F. Saunders, Hartland, Wis.; Habib Vafi, Waukesha, Wis.; David C. Neumann, Milwaukee, Wis.

[73] Assignee: General Electric Company, Milwaukee, Wis.

[21] Appl. No.: 09/218,259

[22] Filed: Dec. 22, 1998

[51] Int. Cl.[7] ................................................ H01R 43/00
[52] U.S. Cl. .............................. 29/825; 257/488; 257/518
[58] Field of Search ....................... 29/825, 830; 257/488, 257/518, 592

[56] References Cited

U.S. PATENT DOCUMENTS 4,857,979  8/1989  McNutt .
5,221,856  6/1993  Dekker et al. .
5,859,450  1/1999  Clark et al. .

*Primary Examiner*—Carl J. Arbes
*Attorney, Agent, or Firm*—B. Joan Haushalter; Christian G. Cabou; Phyllis Y. Price

[57] ABSTRACT

A method is provided for maximizing substrate usage in the fabrication of flat panel displays or detectors, while also maximizing electrostatic protection for the displays or detectors. Initially, at least two detectors are positioned on the substrate, with each of the detectors having a guard ring of a certain width. At least a section of the guard ring width of one detector is approximately adjacent to a section of the guard ring width of another detector. The approximately adjacent guard ring width sections are then positioned such that a maximum overlap of the adjacent guard ring width sections is achieved, while still providing each display or detector with electrostatic discharge protection. Each of the detectors is separated from the other detectors and the remainder of the substrate by the process of scribing partially through the substrate and breaking at the scribe mark or by sawing.

18 Claims, 5 Drawing Sheets

METHOD OF PROVIDING A VARIABLE GUARD RING WIDTH BETWEEN DETECTORS ON A SUBSTRATE

TECHNICAL FIELD

The present invention relates to detectors or displays fabricated on substrates, typically glass, in particular balancing the minimization of size of the detector (x-ray or light) or display (hereinafter generally referred to as detector), thereby maximizing the usage of the substrate area, and maximizing the electrostatic discharge protection afforded by the guard ring; an area of conductive material formed as part of each detector perimeter on a single substrate. A wider guard ring provides more protection, while decreasing the remaining area of the substrate available to form additional detectors.

BACKGROUND OF THE INVENTION

Detectors are replicated on a single insulating substrate (i.e., glass) during fabrication, using a sequence of photomasks and associated processing, as is well known in the art. Detectors on the substrate are separated from one another by the guard ring of each of the detectors. Near the end of the fabrication process, the substrate is scribed and the individual detectors are separated from one another. The detector is comprised of the active area, which is in turn comprised of individual picture elements (or pixels), contact fingers located on the periphery on one or more sides of the active area, and the guard ring. The guard ring forms a perimeter around both the contact fingers and the active area.

The guard ring may be comprised of one or more materials, at least one of which will be conductive. Because the devices which comprise the pixels in the active area are very sensitive to electrostatic discharge (ESD), which may alter their function or destroy them altogether, they must be protected from discharge, particularly during and after separation when the detectors are subject to ESD from handling. The guard ring affords some protection in that its width forms a gap between the edge of the detector which is handled and the contact fingers which form part of a very conductive path directly into the sensitive active area of the detector. Furthermore, the guard ring can be contacted to a known potential (ground, for example) during the fabrication and detector assembly steps which occur after separation (test, for example) and when it is assembled to the associated support electronics in the intended end product. This will further reduce the chance that ESD will damage the devices comprising part of the pixels. Contacting the guard ring to a known potential also indicates the guard ring should be conductive.

The ESD sensitivity of the devices forming part of the pixels in the active area often can not be predicted before they are first fabricated. A device which is very sensitive to ESD will benefit from more protection (i.e., a wider guard ring). The optimum guard ring width cannot be determined during the initial design, meaning that the design, including the sensitive devices and the guard ring width, must be fabricated and tested before the guard ring width can be evaluated. This implies that the final design will be generated only after one or more design iterations have been fabricated and tested. This further implies that the time to complete the design is increased as is the cost of generating additional iterations of the photomasks in order to optimize the guard ring width. A photolithographic exposure tool may be used to position each guard ring. Lastly, the guard ring width cannot be made arbitrarily large because for smaller detectors fabricated on larger substrates, this would imply fewer detectors per substrate are produced, which also would adversely affect cost.

It would be desirable, then, to have a means for providing a variable guard ring width between detectors on a substrate, which guard ring width can be varied for the purpose of experimentally determining the optimal width for ESD protection without the time and expense associated with regenerating the photomasks.

BRIEF SUMMARY OF THE INVENTION

In accordance with the present invention, the effective guard ring width for an individual detector can be varied over a factor of two, by choosing the amount each detector is overlapped during the fabrication process. At the extremes, the guard rings of adjacent detectors would be either totally overlapped or abutted edge to edge, with the latter arrangement providing twice the guard ring width as the former arrangement, ignoring any material lost during separation. With the present invention, any amount of overlap between the extremes is also achievable.

In accordance with one aspect of the present invention, a method for maximizing substrate usage, comprises the step of providing at least two detectors on the substrate, the two detectors each having a guard ring, and the guard rings of the two detectors arranged such that the guard rings are approximately adjacent. The approximately adjacent guard rings are then positioned such that a maximum overlap is achieved which provides minimum ESD protection.

Accordingly, it is an object of the present invention to provide a variable guard ring width. This has the advantages of allowing detector dimensions to be minimized, thereby maximizing substrate usage, while still providing sufficient ESD protection to the detector.

Other objects and advantages of the invention will be apparent from the following description, the accompanying drawings and the appended claims.

DETAILED DESCRIPTION OF THE INVENTION

In accordance with the present invention, the goal of maximizing substrate usage is balanced against the goal of using the guard ring to provide ESD protection. It is accepted in the art that maximum guard ring width will give maximum ESD protection; nevertheless, minimal guard ring width will give maximum substrate usage. The present invention, therefore, maximizes substrate usage by minimizing detector size; minimizes detector size by minimizing guard ring width; yet still provides the opportunity to improve ESD protection without generating new photomasks.

Figure 1:
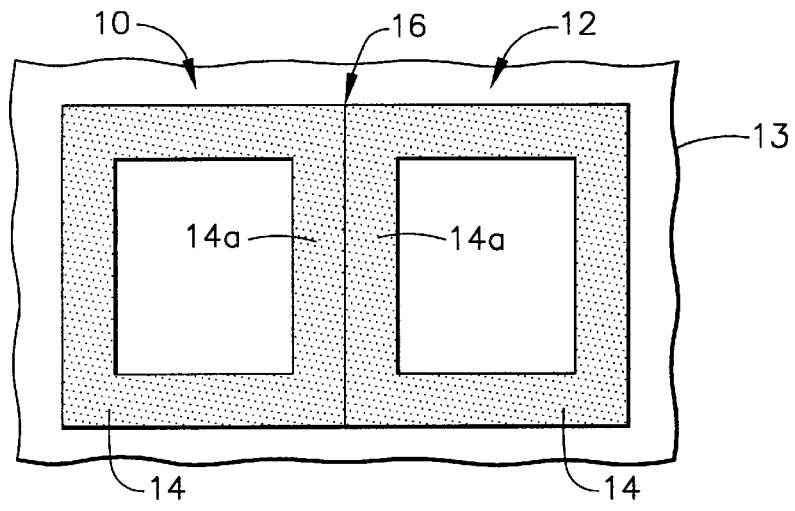
FIG. 1 illustrates two single detectors with abutted guard rings, on a single substrate.

Referring now to the drawings, the concept of the present invention is illustrated. In FIG. 1, two detectors 10 and 12 on a single substrate 13 each have a guard ring 14, typically metal and therefore capable of providing at least some ESD protection. The width of guard ring 14 is in the range from about 0.5 mm to about 10 cm. Adjacent guard ring width portions 14a of each detector are abutted at line 16, but not overlapped. Such an arrangement, while maximizing ESD protection, has the disadvantage of also maximizing detector 10 and 12 size. If a plurality of detectors are arranged on a single substrate, with adjacent guard rings all abutted and never overlapped, the substrate usage is disadvantageously minimized, because the maximum size of the imager active area is limited.

Figure 2:
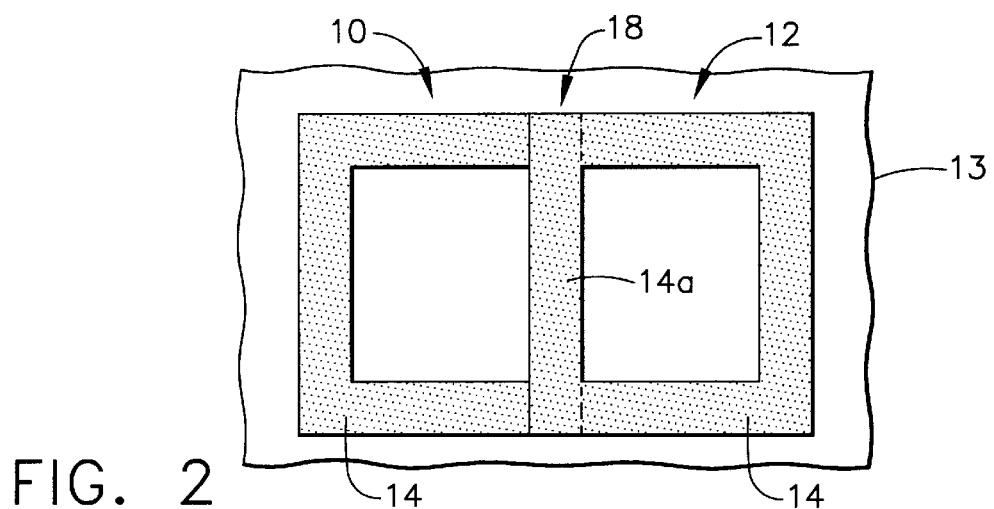
FIG. 2 illustrates two single detectors with 100% overlap of adjacent guard rings.

This particular problem of substrate usage can be corrected by the configuration of FIG. 2, wherein adjacent guard ring width portions 14a of die 10 and 12 are totally overlapped, as indicated by overlap section 18. However, the ESD protection provided by such a configuration is necessarily reduced, as compared to the configuration of FIG. 1. Of course, it will be understood by those skilled in the art that certain applications of detectors may achieve the goal of maximizing substrate usage with the 100% percent overlap, without adversely compromising the ESD protection. Conversely, it will also be understood by those skilled in the art that certain applications of detectors may only be able to achieve the goal of sufficient ESD protection by abutting, but not overlapping, guard rings, as shown in FIG. 1.

Figure 3:
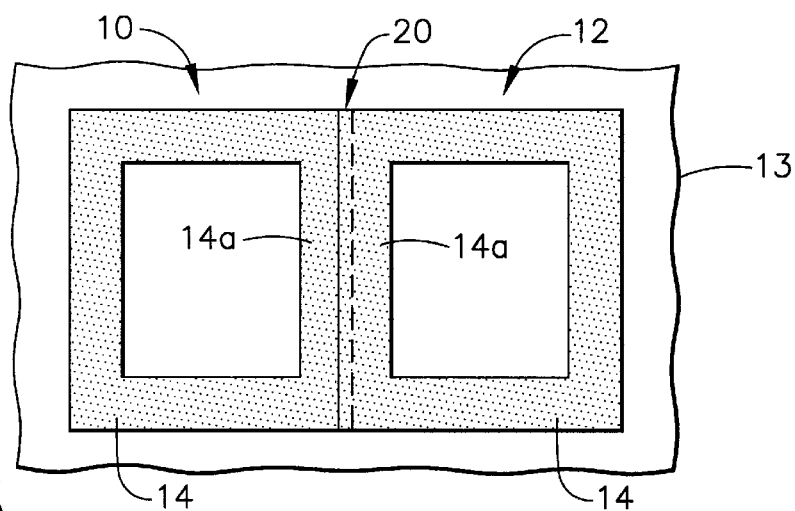
FIG. 3 illustrates two single detectors with the adjacent guard rings partially overlapped.

In accordance with the present invention, sufficient ESD protection can often be provided with partial guard ring width overlap. That is, the goals of maximizing both substrate usage and ESD protection can be achieved without requiring either the complete non-overlap of FIG. 1, or the 100% overlap of FIG. 2. Partial overlap section 20, illustrating a partial overlap of adjacent guard ring width sections 14a, is shown in FIG. 3. Of course, it will be understood by those skilled in the art that the amount of partial overlap can vary, and the amount of partial overlap illustrated in FIG. 3 is not to be considered as limiting the variable guard ring width concept of the present invention.

At the extremes then as illustrated in FIGS. 1 and 2, the guard rings 14a of adjacent detector 10 and 12 can be either abutted edge to edge (FIG. 1) or totally overlapped (FIG. 2), with the former arrangement providing twice the guard ring width as the latter arrangement, ignoring any material lost during separation. With the present invention, any amount of overlap between the extremes (FIG. 3), in addition to the extremes, is also achievable, all without necessitating the generation of additional photomasks.

Figure 4:
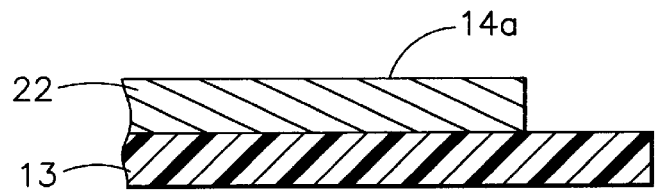
FIG. 4 illustrates a guard ring embodiment wherein the guard ring is comprised of a single layer of conductive material.

The guard ring referred to throughout this discussion may be formed in more than one manner. The most simple embodiment would be that of a single layer of conductive material (referred to as conductive layer 22). FIG. 4 is a representation of a cross section of the right edge of the guard ring width portion 14a of detector 12 and substrate 13 from FIG. 1.

Figure 5:
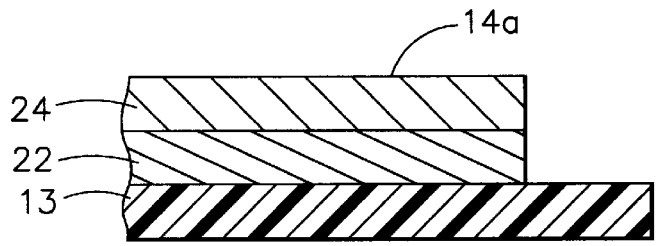
FIG. 5 illustrates another guard ring embodiment wherein the guard ring is comprised of two different layers of conductive material.

FIG. 5 is a representation of the same area shown in FIG. 4 except that the guard ring is formed by two layers of conductive material, shown as first conductive layer 22 and second conductive layer 24. The conducting layers may comprise, for example, Mo, Al, Cr, Ta, Ti, W and ITO, or any multilayer combination of these or similar materials, with thicknesses typically from about 0.05 micron to 1.0 micron. Each conductive layer can be multilayer.

Figure 6:
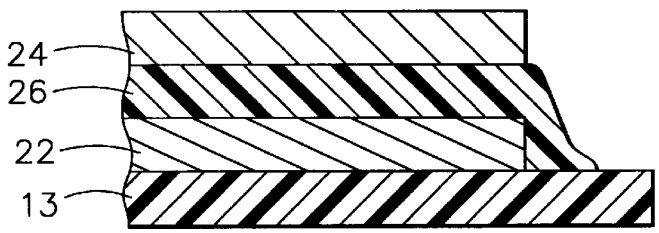
FIG. 6 illustrates yet another embodiment wherein the guard ring is comprised of two different layers of conductive material separated by one layer of non-conductive material.

FIG. 6 illustrates yet another embodiment wherein the guard ring is comprised of two different layers of conductive material 22 and 24 separated by one layer of non-conductive material 26.

Figure 7:
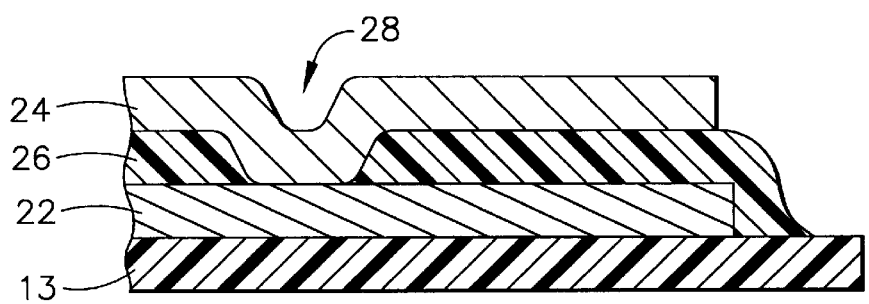
FIG. 7 illustrates yet another alternative embodiment wherein the guard ring is comprised of two different layers of conductive material separated by one layer of non-conductive material in only part of the guard ring, and with a conductive path established between the two layers of conductive material in the remaining part of the guard ring.

FIG. 7 is a representation of the same area as shown in FIG. 4 with a guard ring formed by two layers of conductive material, i.e., conductive layers 22 and 24. The non-conductive material may comprise inorganic dielectrics such as silicon oxide or silicon nitride, or organic dielectrics such as polymide, or a multilayer combination of these materials, with thicknesses typically from about 0.1 micron to 2 microns. The conductive layers 22 and 24 are separated by a non-conductive material 26 in the guard ring area with a conductive path, commonly referred to as a via 28, between conductive layer 22 and conductive layer 24. The via 28 displaces non-conductive material 26 in portions of the guard ring for the purpose of establishing a conductive path between first and second conductive layers 22 and 24. The via is filled with the same material and at the same time as the second conductive layer 24, due largely to the absence of non-conductive material 26 in certain areas of the guard ring.

Figure 8:
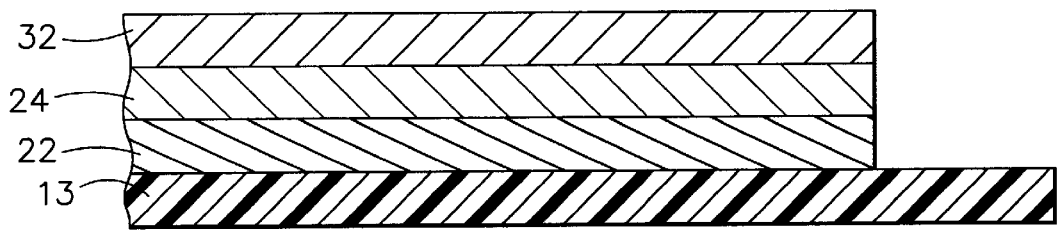
FIGS. 8–17 illustrate additional embodiments of the present invention, to provide for more than two conductive layers, more than one dielectric, and more than one via formed between the various conductive layers.

FIG. 8 is a representation of the same area as shown in FIG. 4, with a guard ring formed by three layers of conductive material (first conductive layer 22, second conductive layer 24, and third conductive layer 32).

Figure 9:
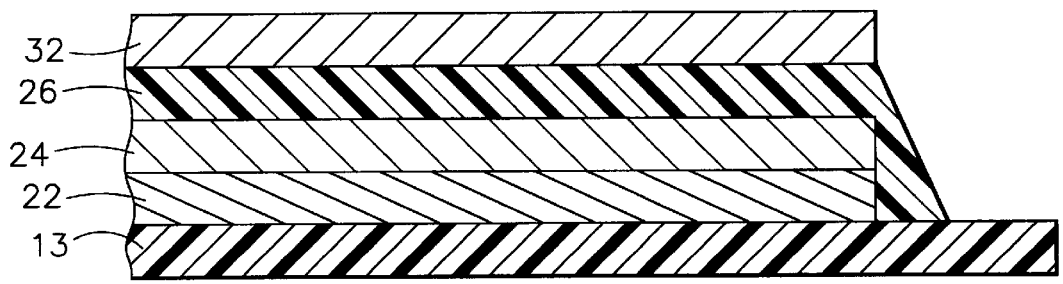

FIG. 9 is also a representation of the same area as shown in FIG. 4, with a guard ring formed by three layers of conductive material (first conductive layer 22, second conductive layer 24, and third conductive layer 32), with the second conductive layer 24 separated from the third conductive layer 32 in the guard ring area by a layer of non-conductive material 26.

Figure 10:
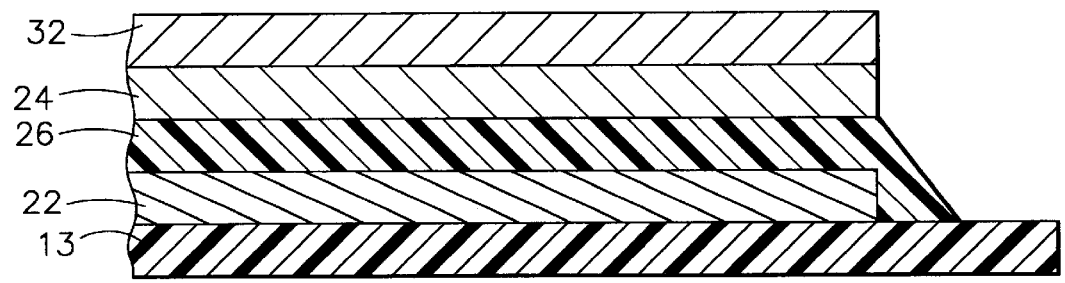

FIG. 10 again is a representation of the same area as shown in FIG. 4, with a guard ring formed by three layers of conductive material (first conductive layer 22, second conductive layer 24, and third conductive layer 32), with the first conductive layer 22 separated from the second conductive layer 24 in the guard ring area by a layer of non-conductive material 26.

Figure 11:
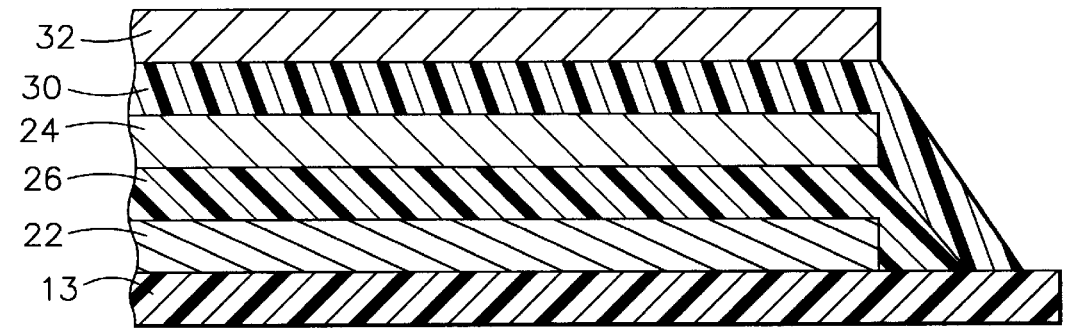

FIG. 11 is also a representation of the same area as shown in FIG. 4, with a guard ring formed by three layers of conductive material (first conductive layer 22, second conductive layer 24, and third conductive layer 32). In this embodiment, the first conductive layer 22 is separated by a layer of non-conductive material 26 from the second conductive layer 24, which in turn is separated by a layer of non-conductive material 30 from the third conductive layer 32.

Figure 12:
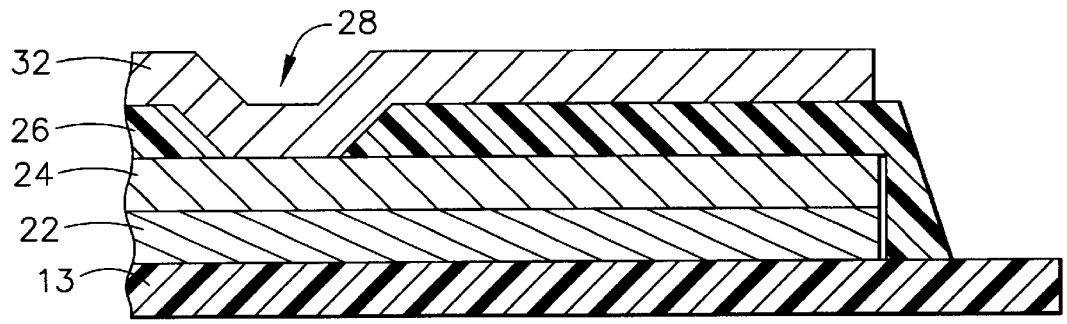

FIG. 12 is a representation of the same area as shown in FIG. 4, with a guard ring formed by three layers of conductive material (first conductive layer 22, second conductive layer 24, and third conductive layer 32). The second conductive layer 24 is separated by a layer of non-conductive material 26 from third conductive layer 32, except in the area of via 28.

Figure 13:
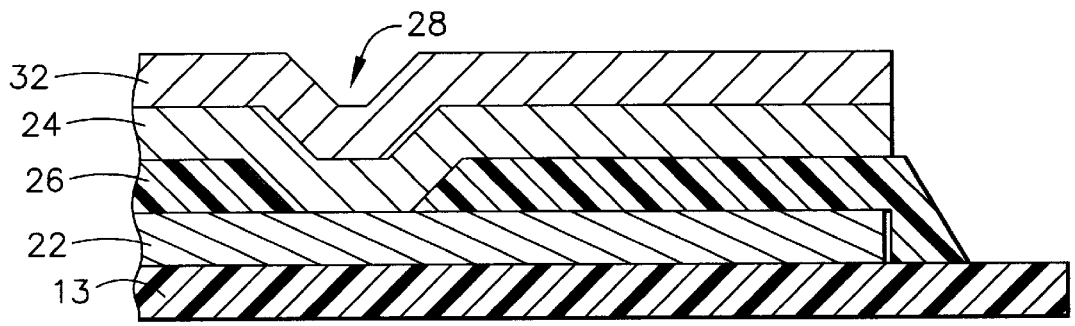

FIG. 13 is also a representation of the same area as shown in FIG. 4, with a guard ring formed by three layers of conductive material (first conductive layer 22, second conductive layer 24, and third conductive layer 32), with first conductive layer 22 separated by a layer of non-conductive material 26 from second conductive layer 24, except in the area of via 28.

Figure 14:
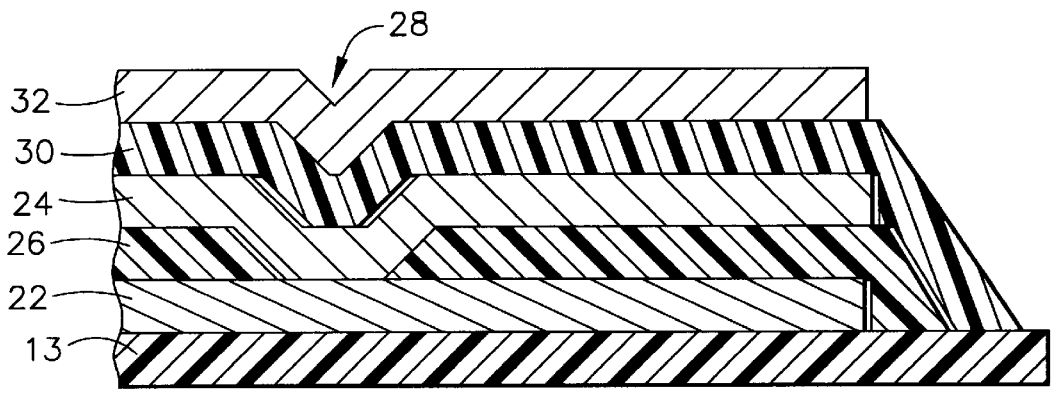

FIG. 14 is, again, a representation of the same area as shown in FIG. 4. In FIG. 14, the guard ring is formed by three layers of conductive material (first conductive layer 22, second conductive layer 24, and third conductive layer 32). The first conductive layer 22 is separated, by a layer of non-conductive material 26, from second conductive layer 24, except in the area of via 28. Also, the second conductive layer 24 is separated, by a layer of non-conductive material 30, from the third conductive layer 32.

Figure 15:
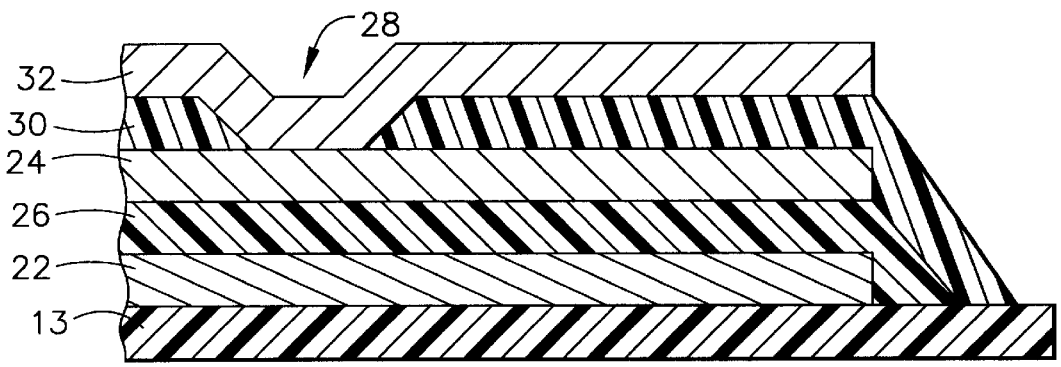

FIG. 15 is yet another representation of the same area as shown in FIG. 4, with a guard ring again formed by three layers of conductive material (first conductive layer 22, second conductive layer 24, and third conductive layer 32). In this embodiment, first conductive layer 22 is separated by a layer of non-conductive material 26 from second conductive layer 24. In addition, second conductive layer 24 is separated by a layer of non-conductive material 30 from third conductive layer 32, except in the area of via 28.

Figure 16:
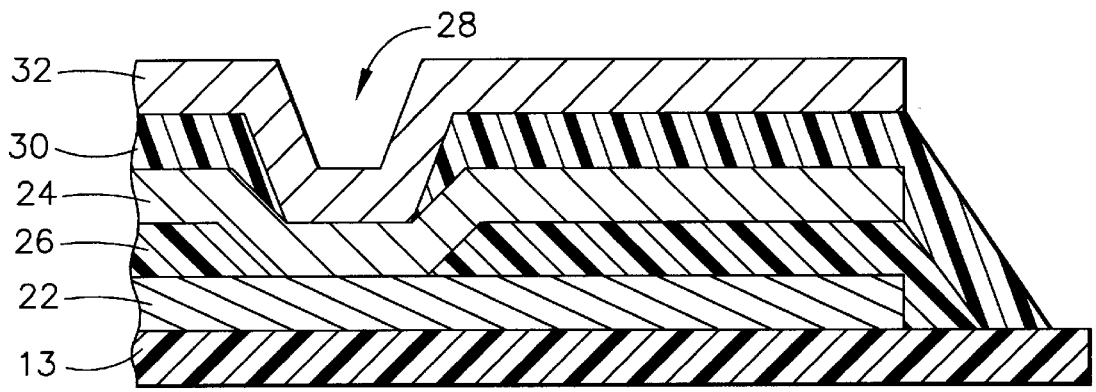

FIG. 16 is yet another embodiment of the same area as shown in FIG. 4, again with a guard ring formed by three layers of conductive material (first conductive layer 22, second conductive layer 24, and third conductive layer 32). In the embodiment of FIG. 16, first conductive layer 22 is separated by a layer of non-conductive material 26 from second conductive layer 24, except in the area of via 28. Furthermore, second conductive layer 24 is separated by a layer of non-conductive material 30 from third conductive layer 32, except in the area of via 28.

Figure 17:
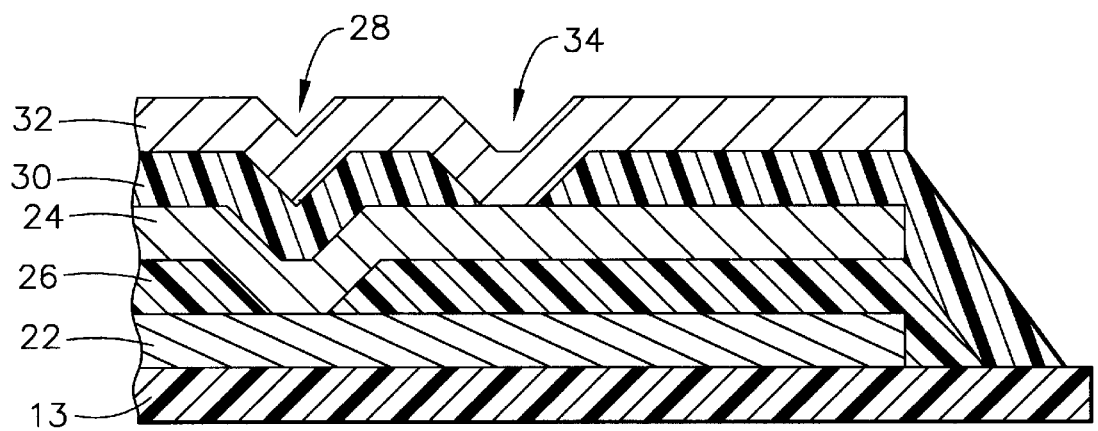

Yet another embodiment of the present invention, shown in FIG. 17, is a representation of the same area as shown in FIG. 4. In FIG. 17, the guard ring is again formed by three layers of conductive material (first conductive layer 22, second conductive layer 24, and third conductive layer 32). The first conductive layer 22 is separated by a layer of non-conductive material 26 from second conductive layer 24, except in the area of via 28. The second conductive layer 24 is separated by a layer of non-conductive material 30 from the third conductive layer 32, except in the area of a second via 34.

The present invention maximizes substrate usage. This is accomplished as described above, with the positioning of the detectors and guard ring width sections. Furthermore, a photolithographic exposure tool can be used to position each detector. Substrate usage can further be maximized by scribing partially through the substrate to define a scribed area and breaking, or sawing, the substrate at the scribed area to separate each of the detectors from every other detector.

As will be recognized by those skilled in the art, the formation of the guard ring is not limited to those formations discussed herein. Corrosion resistant imagers are described and claimed in co-pending patent application Ser. No. 08/996,250, incorporated herein by reference. The guard ring may be one of the many different formations known in the art, in particular, with three conductive layers, and up to two dielectric layers with up to two vias between conductive layers.

The invention has been described in detail with particular reference to certain preferred embodiments thereof, but it will be understood that modifications and variations can be effected within the spirit and scope of the invention.

What is claimed is:

1. A method for maximizing substrate usage in the fabrication of flat panel displays or detectors, comprising the steps of:

providing at least two detectors on the substrate, the two detectors each having a guard ring width;

arranging at least a section of the guard ring width of each of the at least two detectors to be approximately adjacent;

positioning the approximately adjacent guard ring width sections such that edge sections of the adjacent guard ring width sections at least contact while providing each display or detector with electrostatic discharge protection, wherein each of the at least two detectors is separated from every other of the at least two detectors.

2. A method for maximizing substrate usage as claimed in claim 1 wherein the step of positioning the approximately adjacent guard ring width sections comprises the step of partially overlapping the approximately adjacent guard ring width sections.

3. A method for maximizing substrate usage as claimed in claim 1 wherein the step of positioning the approximately adjacent guard ring width sections comprises the step of fully overlapping one approximately adjacent guard ring width section over an other approximately adjacent guard ring width section.

4. A method for maximizing substrate usage as claimed in claim 1 wherein the step of positioning the approximately adjacent guard ring width sections comprises the step of abutting an edge section of one approximately adjacent guard ring width section with an edge sections of another approximately adjacent guard ring width section.

5. A method for maximizing substrate usage as claimed in claim 1 wherein the guard ring width is from about 0.5 mm to about 10 cm.

6. A method for maximizing substrate usage as claimed in claim 1 further comprising the steps of:

scribing partially through the substrate to define a scribed area; and breaking the substrate at the scribed area to separate each of the at least two detectors from every other of the at least two detectors.

7. A method for maximizing substrate usage as claimed in claim 6 further comprising the step of sawing the substrate to separate each of the at least two detectors from every other of the at least two detectors.

8. A method for maximizing substrate usage as claimed in claim 1 further comprising the step of using a photolithographic exposure tool to position each detector.

9. A method for maximizing substrate usage as claimed in claim 1 further comprising the steps of:

forming each guard ring with a single layer of conductive material; and separating each of the at least two detectors from every other of the at least two detectors.

10. A method for maximizing substrate usage as claimed in claim 1 further comprising the step of forming the guard ring of multiple layers of conductive material.

11. A method for maximizing substrate usage as claimed in claim 10 further comprising the step of applying at least one non-conductive material layer to separate at least two adjacent conductive layers.

12. A method for maximizing substrate usage as claimed in claim 11 further comprising the step of providing at least one via formed in at least one of the conductive or non-conductive material layers.

13. As claimed in claim 12 whereby the at least one non-conductive material layer separates adjacent conductive material layers, except at the at least one via.

14. A method for maximizing substrate usage as claimed in claim 1 further comprising the step of forming the guard ring of a first and second conductive material interposed with a layer of non-conductive material, whereby the first and second conductive layers lack a conductive path.

15. A method for maximizing substrate usage, comprising the steps of:

provibing at least two detectors, the at least two detectors each having a guard ring width; and positioning the at least two detectors to minimize detector size by overlapping at least a portion of the guard ring width of one of the at least two detectors with at least a portion of the guard ring width of another of the at least two detectors.

16. A method for maximizing substrate usage as claimed in claim 15 wherein the step of positioning comprises the step of fully overlapping a guard ring width of one detector with an adjacent guard ring width of another detector.

17. A method for maximizing substrate usage as claimed in claim 15 wherein the step of positioning comprises the step of partially overlapping a guard ring width of one detector with an adjacent guard ring width of another detector.

18. A method for maximizing substrate usage as claimed in claim 15 further comprising the step of providing electrostatic discharge protection for the substrate.

\* \* \* \* \*